United States Patent
Tsutsumi et al.

(10) Patent No.: US 10,461,756 B2
(45) Date of Patent: Oct. 29, 2019

(54) PLL CIRCUIT

(71) Applicant: MITSUBISHI ELECTRIC CORPORATION, Tokyo (JP)

(72) Inventors: Koji Tsutsumi, Tokyo (JP); Yuki Yanagihara, Tokyo (JP); Mitsuhiro Shimozawa, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/344,758

(22) PCT Filed: Dec. 19, 2016

(86) PCT No.: PCT/JP2016/087780
§ 371 (c)(1),
(2) Date: Apr. 24, 2019

(87) PCT Pub. No.: WO2018/116347
PCT Pub. Date: Jun. 28, 2018

(65) Prior Publication Data
US 2019/0305781 A1  Oct. 3, 2019

(51) Int. Cl.
*H03L 7/089* (2006.01)
*H03L 7/197* (2006.01)
*H03L 7/099* (2006.01)

(52) U.S. Cl.
CPC ............ *H03L 7/0891* (2013.01); *H03L 7/099* (2013.01); *H03L 7/197* (2013.01)

(58) Field of Classification Search
CPC ........ H03L 7/0891; H03L 7/099; H03L 7/197
See application file for complete search history.

(56) References Cited

U.S. PATENT DOCUMENTS

| | | | | |
|---|---|---|---|---|
| 5,754,587 A | * | 5/1998 | Kawaguchi | ......... H04L 25/4915 341/58 |
| 5,977,805 A | * | 11/1999 | Vergnes | ................. H03B 28/00 327/107 |
| 7,636,386 B2 | * | 12/2009 | McCune, Jr. | ........ H03C 3/0941 332/127 |

(Continued)

FOREIGN PATENT DOCUMENTS

JP  8-242167 A  9/1996

OTHER PUBLICATIONS

Jaeger et al., "Concepts for Highly Integrated Automotive Radar Circuits", EuMW 2015, WS 12: EuMIC-7-SiGe for mm-Wave and THz, total of 22 pages.

(Continued)

*Primary Examiner* — Dinh T Le
(74) *Attorney, Agent, or Firm* — Birch, Stewart, Kolasch & Birch, LLP

(57) ABSTRACT

A first frequency accumulator (7a) operates using an output signal of a variable frequency divider (3) as a clock. A second frequency accumulator (7b) operates using a reference signal from a reference signal source (1) as a clock. A comparison operating circuit (11) compares the output values of the first frequency accumulator (7a) and the second frequency accumulator (7b), and calculates a parameter so that a result of the comparison falls within a set value. A digital-analog converter (9) outputs a signal to be added to an output of a loop filter (6) depending on the parameter output from the comparison operating circuit (11).

5 Claims, 8 Drawing Sheets

(56) References Cited

U.S. PATENT DOCUMENTS 8,867,696 B2 * 10/2014 Regimbal .............. H03K 5/156
   327/115
8,947,671 B2 *  2/2015 Strandjord ........... G01C 19/721
   356/461

OTHER PUBLICATIONS

Kao et al., "A Low-Power and High-Precision Spread Spectrum Clock Generator for Serial Advanced Technology Attachment Applications Using Two-Point Modulation", IEEE Transactions on Electromagnetic Compatibility, vol. 51, No. 2, May 2009, pp. 245-254.

* cited by examiner ic
PLL CIRCUIT

TECHNICAL FIELD

The present invention relates to a PLL circuit that compares the phase of an output signal of a voltage-controlled oscillator (VCO) with the phase of a reference signal, and feeds the comparison result back to the voltage-controlled oscillator, to stabilize the oscillation frequency of the voltage-controlled oscillator.

BACKGROUND ART

A PLL circuit is a circuit that compares the phase of an output signal of a voltage-controlled oscillator (hereinafter referred to as VCO) with the phase of a reference signal, and feeds the comparison result back to the VCO, to stabilize the oscillation frequency of the VCO. In this PLL circuit, it is possible to output modulated waves from the VCO by performing time control on the ratio between the VCO frequency and the reference signal frequency. Accordingly, it is possible for the PLL circuit to generate the chirp signal to be used as transmission waves of a frequency modulated continuous wave (FMCW) radar, for example (see Non-Patent Literature 1, for example).

In a conventional PLL circuit that generates a chirp signal, the frequency dividing ratio at which the output of a VCO is subjected to frequency dividing by a variable frequency divider is controlled by a control circuit formed with a timing controlling circuit, a frequency accumulator, and a ΔΣ modulator, so that the chirp signal can be output from the VCO (see Non-Patent Literature 2, for example). However, in a case where a chirp signal is generated by a PLL circuit, changes in the output frequency over time are limited by a loop filter. Therefore, followability deteriorates at points where the frequency changes rapidly, for example, at portions with steep frequency gradients in sawtooth waves. To solve this problem, in a conventional PLL circuit, the output of a digital-analog converter (DAC) is added between a VCO and a loop filter, and the frequency control voltage of the VCO is made to shift at a higher speed than in the PLL loop band.

CITATION LIST

Non-Patent Literature

Non-Patent Literature 1: Herbert Jaeger and Matthias Porranzl, "Concepts for Highly Integrated Automotive Radar Circuits", EuMW 2015, WS 12: EuMIC-7-SiGe for mm-Wave and THz Non-Patent Literature 2: Yao-Huang Kao and Yi-Bin Hsieh, "A Low-Power and High-Precision Spread Spectrum Clock Generator for Serial Advanced Technology Attachment Applications Using Two-Point Modulation", IEEE TRANSACTIONS ON ELECTROMAGNETIC COMPATIBILITY, VOL. 51, NO. 2, MAY 2009

SUMMARY OF INVENTION

Technical Problem

However, the above-mentioned conventional PLL circuit has a problem in determining parameters such as the amplitude and the timing of the signal to be added from the DAC. That is, in order to generate a high-precision chirp signal even in a case where the relationship between the control voltage and the output frequency of the VCO, the loop filter band, or the like varies due to variation of circuits, an optimum DAC output waveform needs to be calculated in each case. However, in the conventional PLL circuit, it is difficult to obtain a high-precision chirp signal while coping with quick frequency changes.

The present invention has been made to solve the above problem, and aims to provide a PLL circuit capable of obtaining a high-precision chirp signal, and coping with an output signal with steep frequency changes.

Solution to Problem

A PLL circuit according to this invention includes: a voltage-controlled oscillator to transmit a frequency signal corresponding to the voltage of a supplied signal; a variable frequency divider to perform frequency dividing on an output signal of the voltage-controlled oscillator at a supplied frequency dividing ratio; a phase frequency comparator to compare an output signal of the variable frequency divider with a reference signal; a charge pump to output a signal corresponding to a result of the comparison performed by the phase frequency comparator; a loop filter to supply a signal obtained by smoothing the output signal of the charge pump to the voltage-controlled oscillator; a ΔΣ modulator to generate the frequency dividing ratio for the variable frequency divider depending on a supplied signal; a first frequency accumulator to operate using the output signal of the variable frequency divider as a clock, and generate an output value corresponding to the clock as an input value for the ΔΣ modulator; a second frequency accumulator to operate using the reference signal as a clock, and generate an output value corresponding to the clock; a comparison operating circuit to compare the output values of the first frequency accumulator and the second frequency accumulator, and calculate a parameter so that a result of the comparison falls within a set value; and a digital-analog converting circuit to output a signal to be added to an output of the loop filter depending on the parameter output from the comparison operating circuit.

Advantageous Effects of Invention

A PLL circuit according to this invention includes a first frequency accumulator using a signal obtained by frequency dividing a signal from a voltage-controlled oscillator, as a clock, and a second frequency accumulator using a reference signal as a clock. The PLL circuit calculates a parameter so that a comparison result between output values of these accumulators fall within a set value, and, depending on the parameter, a digital-analog converter outputs a signal to be added to an output of a loop filter. With this configuration, the signal to be added from the digital-analog converter can be made to accurately follow changes in frequency. As a result, for an output signal of the PLL circuit, it is possible to cope with steep frequency changes.

DESCRIPTION OF EMBODIMENTS

To explain the present invention in greater detail, modes for carrying out the invention are described below with reference to the accompanying drawings.

First Embodiment

Figure 1:
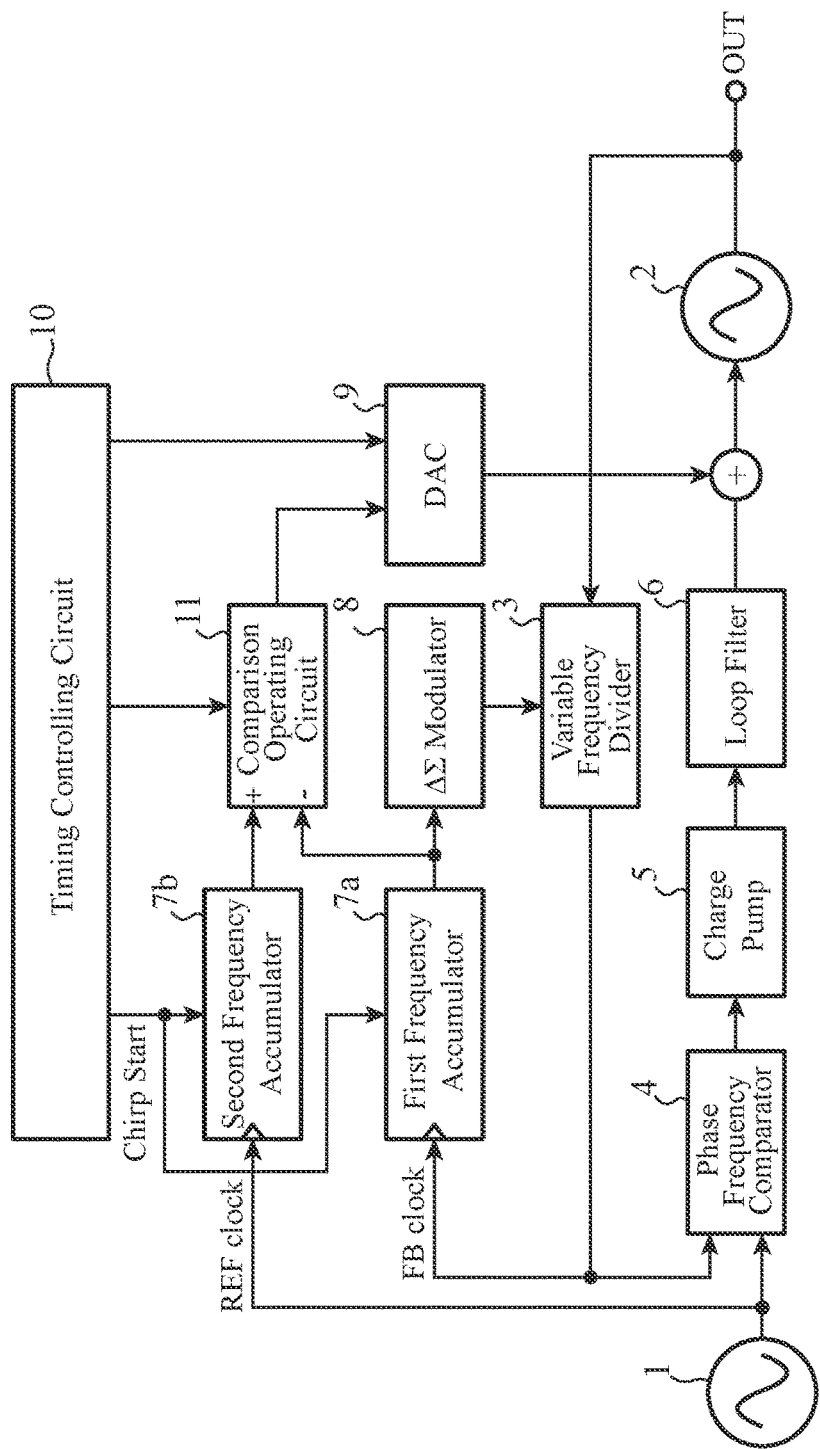
FIG. 1 is a configuration diagram of a PLL circuit according to a first embodiment of the present invention.

FIG. 1 shows an example of a PLL circuit according to a first embodiment. The PLL circuit includes a reference signal source (REF) 1, a voltage-controlled oscillator (VCO) 2, a variable frequency divider 3, a phase frequency comparator 4, a charge pump 5, a loop filter 6, a first frequency accumulator 7a, a second frequency accumulator 7b, a ΔΣ modulator 8, a digital-analog converter (DAC) 9, a timing controlling circuit 10, and a comparison operating circuit 11.

The reference signal source 1 is a signal source that generates a reference signal for the PLL circuit. The voltage-controlled oscillator 2 is a circuit that generates an output signal of the PLL circuit. An added signal of an output signal of the loop filter 6 and an output signal of the digital-analog converter 9 is supplied to a frequency control terminal of the voltage-controlled oscillator 2. The variable frequency divider 3 is a circuit that receives the output of the voltage-controlled oscillator 2, and performs frequency dividing by N (N being an integer) on the basis of an output signal from the ΔΣ modulator 8. The phase frequency comparator 4 is a circuit that receives the reference signal from the reference signal source 1 and an output signal of the variable frequency divider 3, compares the phases and the frequencies between these signals, and outputs a signal indicating a result of the comparison. The charge pump 5 is a circuit that receives the output signal of the phase frequency comparator 4, and outputs a pulse signal of the current corresponding to the output signal. The loop filter 6 is a filter that performs smoothing as well as current-voltage conversion on the output signal of the charge pump 5, and output the resultant signal.

The first frequency accumulator 7a is a circuit that operates using the output of the variable frequency divider 3 as a clock, and generates an output value corresponding to the clock. Meanwhile, the second frequency accumulator 7b is a circuit that operates using the reference signal from the reference signal source 1 as a clock, and generates an output value corresponding to the clock. That is, the first and second frequency accumulators 7a and 7b each have a function of generating frequency information for a chirp signal by accumulating a frequency value each time a clock is input. Accordingly, the internal accumulated amount and the accumulation polarity (up-chirp or down-chirp), the waveform type (sawtooth waves, triangular waves, or the like), and the like can be set depending on a parameter indicating what type of chirp signal is to be generated, for example. The ΔΣ modulator 8 is a circuit that generates a control signal for the frequency dividing ratio in the variable frequency divider 3, on the basis of the output value of the first frequency accumulator 7a. The digital-analog converter 9 is a circuit that outputs a signal to be added to the output of the loop filter 6, on the basis of a control signal from the timing controlling circuit 10 and depending on a parameter output from the comparison operating circuit 11. The timing controlling circuit 10 is a circuit that outputs a chirp start signal to each of the first frequency accumulator 7a and the second frequency accumulator 7b, a control signal to the comparison operating circuit 11, and a control signal to the digital-analog converter 9, to perform timing control on these circuits. The comparison operating circuit 11 is a circuit that compares the output values of the first frequency accumulator 7a and the second frequency accumulator 7b, calculates a parameter so that the result of the comparison falls within a set value, and outputs this parameter to the digital-analog converter 9.

The output signal of the voltage-controlled oscillator 2, which is also an output signal of the PLL circuit, is frequency-divided by the variable frequency divider 3, and then is input to the phase frequency comparator 4. Here, the frequency dividing ratio in the variable frequency divider 3 is controlled so that the output of the PLL circuit becomes desired modulation waves. The ΔΣ modulator 8 controls the frequency dividing ratio, by generating a frequency dividing ratio pattern corresponding to the frequency value output from the first frequency accumulator 7a and outputting the frequency dividing ratio pattern to the variable frequency divider 3. The first frequency accumulator 7a operates using the output (FB clock) of the variable frequency divider 3 as a clock, and the start timing of a chirp signal and the like are determined depending on a signal from the timing controlling circuit 10. The output signal of the reference signal source 1 and the output signal of the variable frequency divider 3 are input to the phase frequency comparator 4, and a signal indicating a result of the comparison is output to the charge pump 5. The charge pump 5 outputs a pulse signal of the current corresponding to the output signal from the phase frequency comparator 4. The output signal of the charge pump 5 is subjected to current-voltage conversion and smoothing by the loop filter 6, and is then supplied to the frequency control terminal of the voltage-controlled oscillator 2. The above is the description of the configuration of the PLL circuit that generates a normal chirp signal.

The second frequency accumulator 7b is basically the same circuit as the first frequency accumulator 7a, except for operation using the output (REF clock) of the reference signal source 1 as a clock. The start timing of the chirp signal is also the same as that of the first frequency accumulator 7a. The comparison operating circuit 11 compares the output values of the first frequency accumulator 7a and the second frequency accumulator 7b at a timing designated by the timing controlling circuit 10, and outputs the parameter calculated from the comparison result to the digital-analog converter 9. Depending on the parameter supplied from the comparison operating circuit 11, the digital-analog converter 9 outputs a signal in synchronization with the timing signal output from the timing controlling circuit 10. The signal output from the digital-analog converter 9 is added to the output of the loop filter 6, and is then supplied to the voltage-controlled oscillator 2.

Figure 2A:
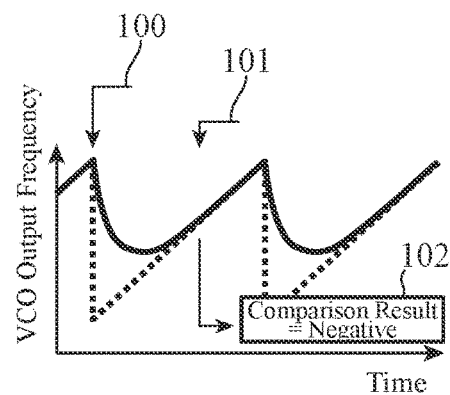
FIG. 2A through FIG. 2D are graphs for explaining output waveforms during operations of the PLL circuit according to the first embodiment of the present invention.

Next, the operation of this circuit is described. FIGS. 2A through 2D show output waveforms observed when this circuit outputs an up-chirp signal (sawtooth waves of a frequency increasing type). In each of these graphs, a dashed line represents an ideal waveform, and a solid line represents an output waveform of the PLL circuit. Further, an arrow 100 indicates the chirp start timing, an arrow 101 indicates the comparison timing, and a comparison result 102 indicates a result of comparison performed by the comparison operating circuit 11 at the comparison timing. FIG. 2A illustrates a case where there is no signal to be added from the digital-analog converter 9. In this case, due to the influence of the PLL loop band, a waveform rounded more than the ideal waveform is output from the voltage-controlled oscillator 2. In this case, the frequency of the output waves from the voltage-controlled oscillator 2 is higher than the original (ideal) frequency during the period from the chirp start timing until convergence of the transient response. Because of this, the FB clock obtained by performing frequency dividing on the output of the voltage-controlled oscillator 2 has a higher frequency than that of the REF clock. As a result, there occurs a difference between the outputs of the frequency accumulators that operate using these two signals as the corresponding clocks, and the result of the comparison between the outputs of the frequency accumulators at the comparison timing shown in the graph is negative.

Figure 2B:
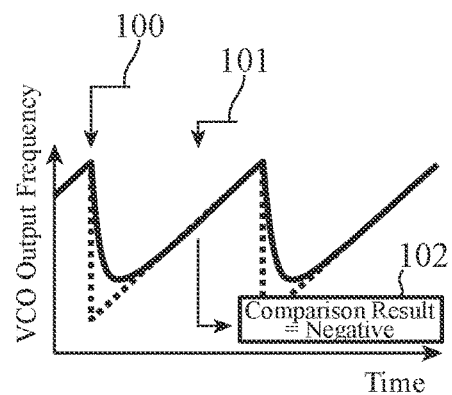
Figure 2C:
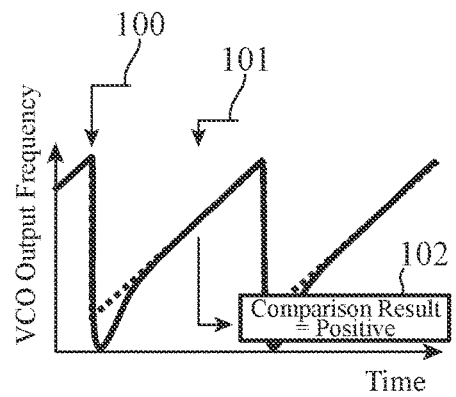
Figure 2D:
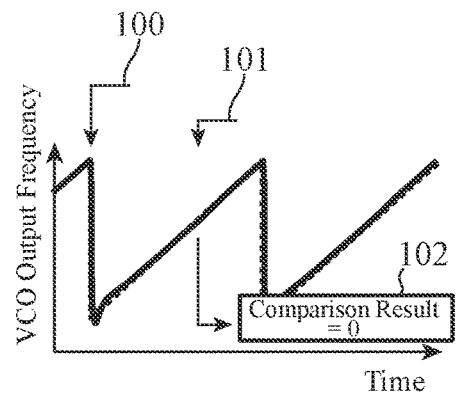

FIG. 2B illustrates the waveform observed in a case where the signal addition amount from the digital-analog converter 9 is small. By the addition of the signal from the digital-analog converter 9, the output waveform from the voltage-controlled oscillator 2 approaches the ideal waveform. However, the frequency of the FB clock is still higher than that of the REF clock, and therefore, the comparison result is also negative. FIG. 2C illustrates a case where the signal addition amount from the digital-analog converter 9 is too large. In this case, the frequency drop at the chirp start timing in the output of the voltage-controlled oscillator 2 is large, and thus the frequency of the FB clock is lower than that of the REF clock. Accordingly, the comparison result is positive. FIG. 2D illustrates a case where the addition amount by the digital-analog converter 9 is appropriate. In this case, the frequencies of the REF clock and the FB clock coincide with each other, and the comparison result is 0. In this case, the output waveform of the voltage-controlled oscillator 2 is closest to the ideal waveform.

With the above principle, feedback is applied to the DAC output waveform so that the result of comparison between the outputs of the two frequency accumulators becomes 0. In this manner, the signal to be added becomes an appropriate signal, and thus the chirp waveform of the VCO output can be made closer to the ideal waveform. This is the operating principle of this circuit.

Figure 3A:
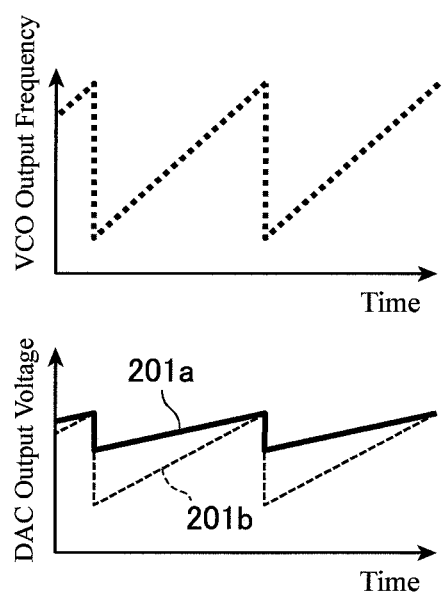
FIG. 3A and FIG. 3B are graphs for explaining output waveforms of a digital-analog converter in the PLL circuit according to the first embodiment of the present invention.
Figure 3B:
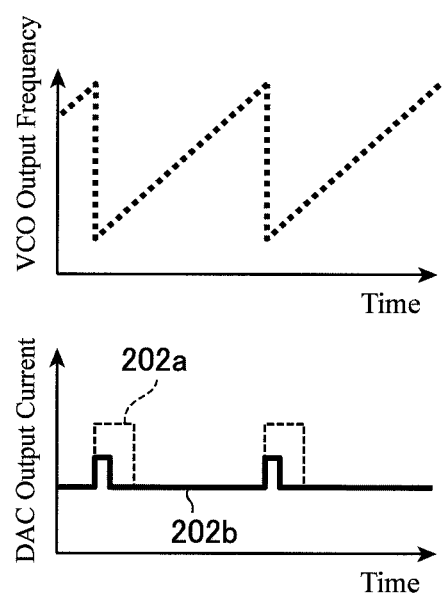

FIG. 3 shows examples of signals to be added output from the DAC. FIG. 3A illustrates a case where a voltage output DAC is used. Increasing the addition amount means increasing the voltage amplitude. In the DAC output voltage, a solid line 201a indicates the smaller addition amount, and a dashed line 201b indicates the larger addition amount. FIG. 3B illustrates a case where a current output DAC is used. In the DAC output current, a solid line 202b indicates the smaller addition amount, and a dashed line 202a indicates the larger addition amount. In the example illustrated in FIG. 3B, both the current value and the addition time are increased, so that the addition amount is increased. However, it is possible to change only the current value or the addition time as a parameter. Note that, in this circuit, it is ideal to apply the feedback to the DAC output waveform so that the result of comparison between the outputs of the two frequency accumulators becomes 0. However, the comparison result may be a value within a preset set value.

As described above, the PLL circuit according to the first embodiment includes: a voltage-controlled oscillator that transmits a frequency signal corresponding to the voltage of a supplied signal; a variable frequency divider that performs frequency dividing on the output signal of the voltage-controlled oscillator at a supplied frequency dividing ratio; a phase frequency comparator that compares the output signal of the variable frequency divider with a reference signal; a charge pump that outputs a signal corresponding to a result of the comparison performed by the phase frequency comparator; a loop filter that supplies a signal obtained by smoothing the output signal of the charge pump to the voltage-controlled oscillator; a ΔΣ modulator that generates the frequency dividing ratio for the variable frequency divider depending on a supplied signal; a first frequency accumulator that operates using the output signal of the variable frequency divider as a clock, and generates an output value corresponding to the clock as an input value for the ΔΣ modulator; a second frequency accumulator that operates using the reference signal as a clock, and generates an output value corresponding to the clock; a comparison operating circuit that compares the output values of the first frequency accumulator and the second frequency accumulator, and calculates a parameter so that the comparison result falls within a set value; and a digital-analog converting circuit that outputs the signal to be added to the output of the loop filter depending on the parameter output from the comparison operating circuit. With this configuration, the signal to be added from the digital-analog converter can be made to accurately follow changes in frequency. As a result, for the output signal of the PLL circuit, it is possible to cope with steep changes in frequency.

Second Embodiment

Figure 4:
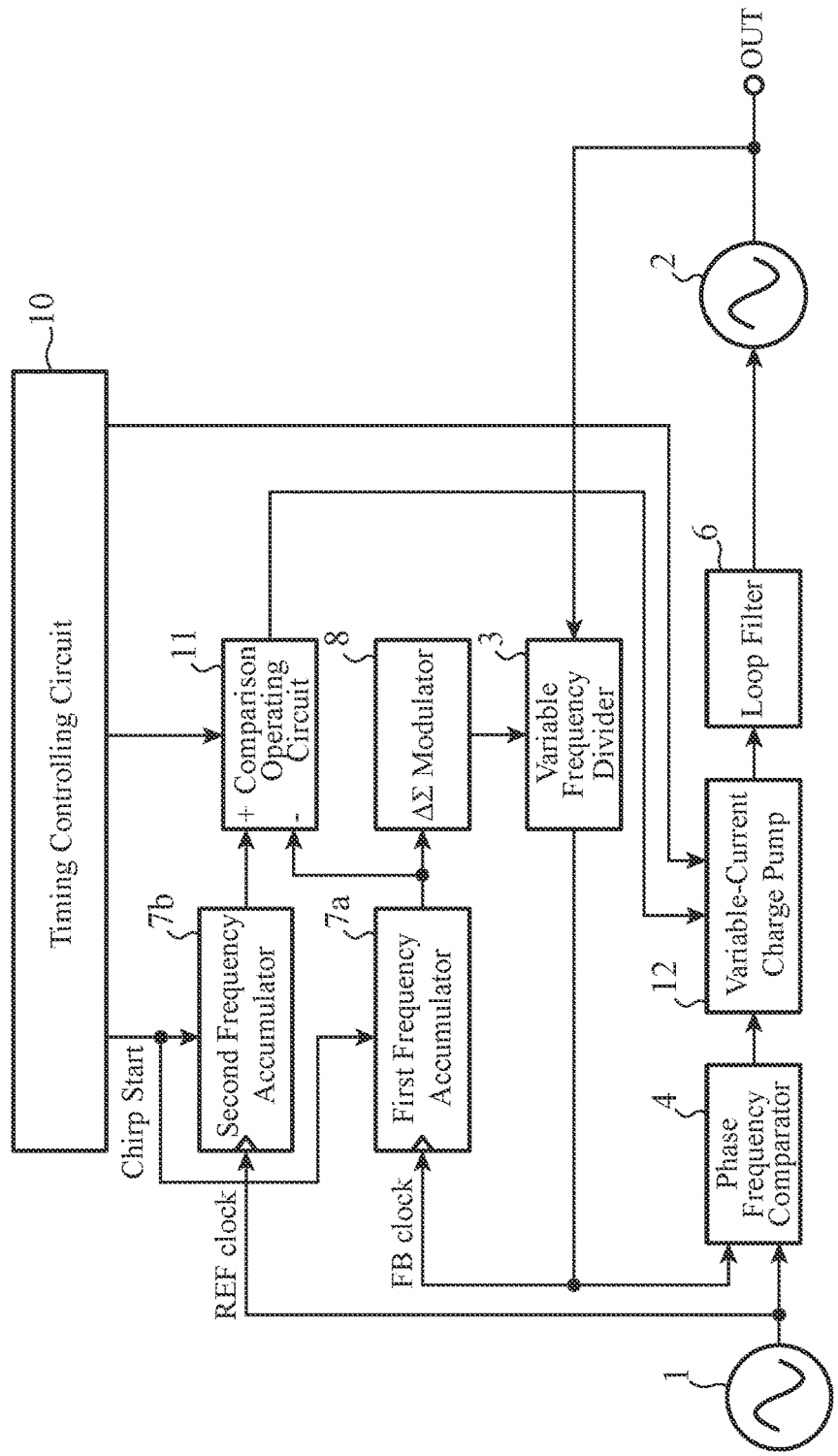
FIG. 4 is a configuration diagram of a PLL circuit according to a second embodiment of the present invention.

FIG. 4 shows an example of a PLL circuit according to a second embodiment. The difference from the first embodiment is that without waveform addition performed by the digital-analog converter 9, the current value of the charge pump is variable, and thereby a large current value is set only during time periods during which the frequency change is large. That is, in the PLL circuit according to the second embodiment, the charge pump 5 of the first embodiment is replaced with a variable-current charge pump 12, and the output of the comparison operating circuit 11 is input to the variable-current charge pump 12. In FIG. 4, the other components, from the reference signal source 1 to the timing controlling circuit 10, are the same as those of the first embodiment shown in FIG. 1. Therefore, the corresponding components are denoted by the same reference numerals as those used in FIG. 1, and explanation thereof is not made herein.

Figure 5A:
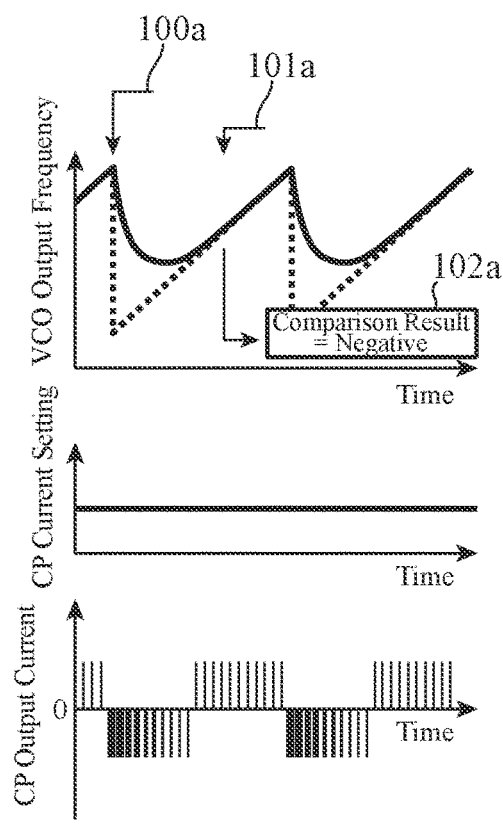
FIG. 5A and FIG. 5B are graphs for explaining output waveforms of a variable-current charge pump in the PLL circuit according to the second embodiment of the present invention.
Figure 5B:
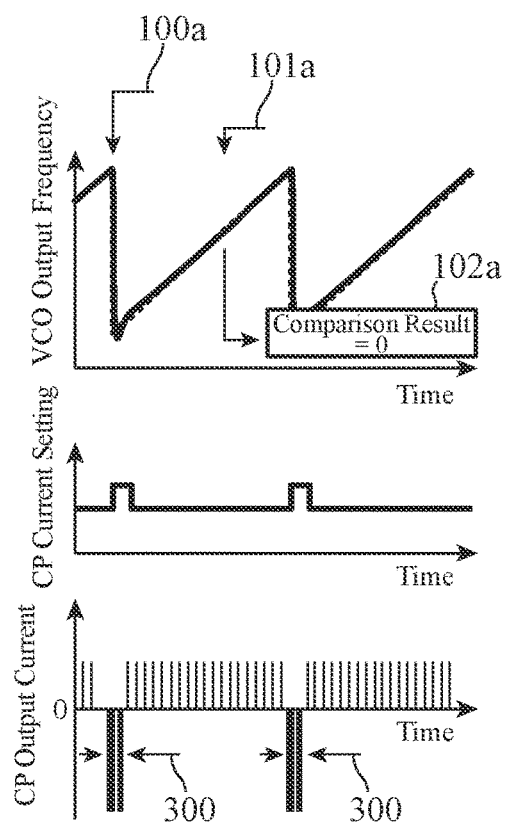

The operating principle in the second embodiment is similar to that in the first embodiment. FIG. 5 shows examples of the waveform of the output from the voltage-controlled oscillator 2 and the waveform of the output current of the variable-current charge pump 12. In each of these graphs, a dashed line represents an ideal waveform, and a solid line represents an output waveform of the PLL circuit. Further, an arrow 100a indicates the chirp start timing, an arrow 101a indicates the comparison timing, and a comparison result 102a indicates a result of comparison at the comparison timing. FIG. 5A shows the waveform in a case where the current of the variable-current charge pump 12 does not vary. The control voltage of the voltage-controlled oscillator 2 must be lowered in a section where the frequency change immediately after the chirp start timing is steep. However, sufficient electric charge is not supplied to the loop filter 6, and therefore, the frequency waveform of the output of the voltage-controlled oscillator 2 is rounded. As shown in FIG. 5B, on the other hand, the current value of the charge pump is increased only at points where the frequency change is steep (see arrows 300). Because of this, the amount of electric charge to be supplied increases, and the frequency followability improves accordingly. As a result, the frequencies of the REF clock and the FB clock coincide with each other, and the result of comparison between the outputs of the two accumulators becomes 0. Because of this principle, it is possible to output an optimum chirp signal, by adjusting both a parameter for the current set value of the variable-current charge pump 12 immediately after the chirp start and a parameter for the duration during which the setting of the larger current value is maintained so that the result of the comparison at the comparison operating circuit 11 becomes 0. It is also effective to fix one of the current value and the duration of the larger current value, and optimize only the other.

Note that, if the current value of the charge pump is made larger, the PLL loop band widens, which is disadvantageous in terms of phase noise characteristics. In this aspect, the time for increasing the current of the charge pump is optimized by this circuit, so that the convergence time of the chirp signal can be shortened while the time during which phase noise gets worse is minimized. This is another advantage to be achieved by this circuit.

As described above, the PLL circuit according to the second embodiment includes: a voltage-controlled oscillator that transmits a frequency signal corresponding to the voltage of a supplied signal; a variable frequency divider that performs frequency dividing on the output signal of the voltage-controlled oscillator at a supplied frequency dividing ratio; a phase frequency comparator that compares the output signal of the variable frequency divider with a reference signal; a charge pump that outputs a signal corresponding to a result of the comparison performed by the phase frequency comparator, and is capable of changing the output depending on a supplied parameter; a loop filter that supplies a signal obtained by smoothing the output signal of the charge pump to the voltage-controlled oscillator; a ΔΣ modulator that generates the frequency dividing ratio for the variable frequency divider depending on a supplied signal; a first frequency accumulator that operates using the output of the variable frequency divider as a clock, and generates an output value corresponding to the clock as an input value for the ΔΣ modulator; a second frequency accumulator that operates using the reference signal as a clock, and generates an output value corresponding to the clock; and a comparison operating circuit that compares the output values of the first frequency accumulator and the second frequency accumulator, and calculates the parameter for the charge pump so that the comparison result falls within a set value. With this configuration, the output signal from the charge pump can be made to accurately follow changes in frequency. As a result, for the output signal of the PLL circuit, it is possible to cope with steep changes in frequency.

Third Embodiment

Figure 6:
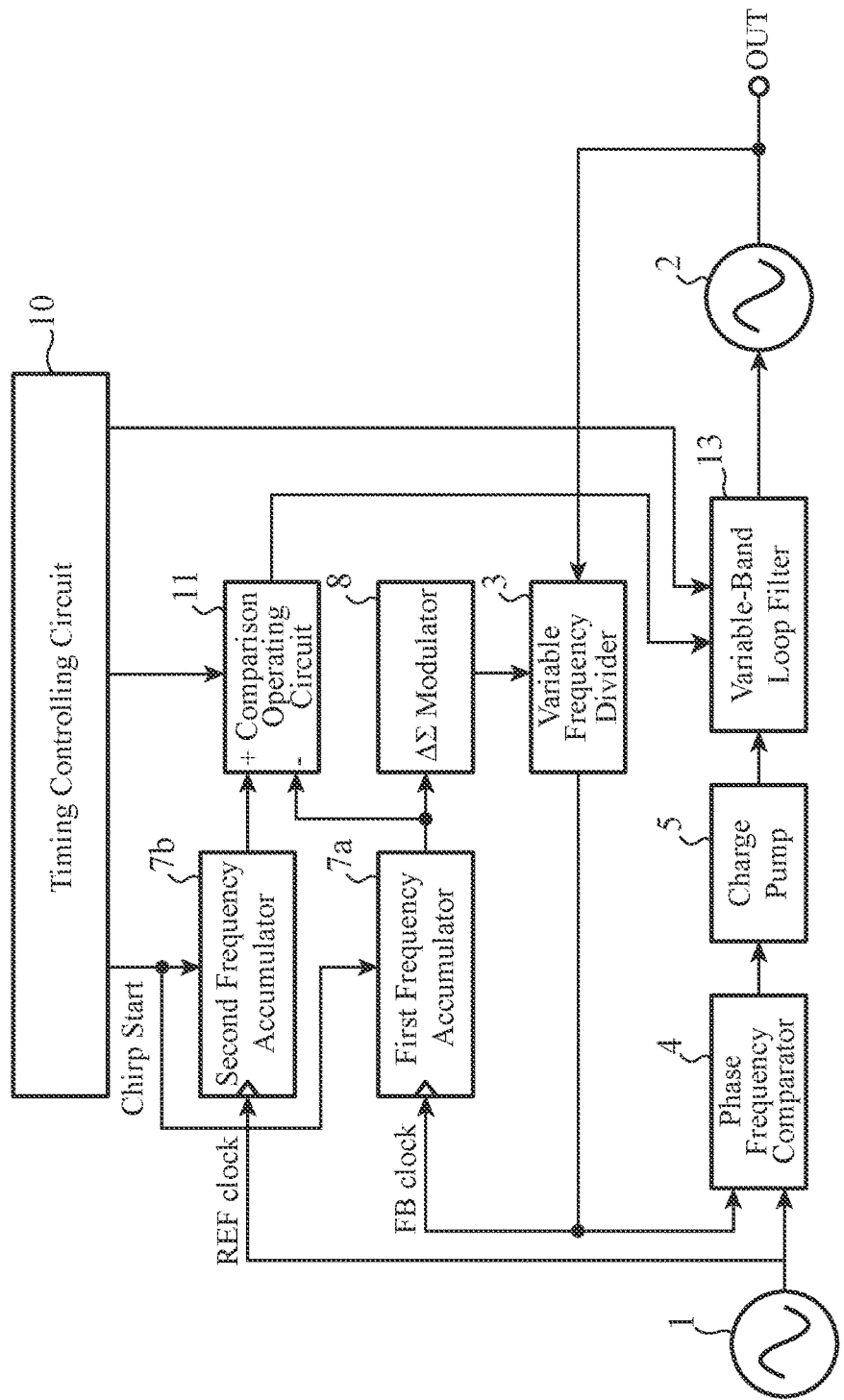
FIG. 6 is a configuration diagram of a PLL circuit according to a third embodiment of the present invention.

FIG. 6 shows an example of a PLL circuit according to a third embodiment. The difference from the first embodiment is that without waveform addition performed by a digital-analog converter, the loop filter band is variable, and thereby a great bandwidth is set only in sections during which the frequency change is large. In the third embodiment, the loop filter 6 of the circuit shown in FIG. 1 is replaced with a variable-band loop filter 13, and the output of the comparison operating circuit 11 is input to the variable-band loop filter 13. That is, the variable-band loop filter 13 is a loop filter that can change the frequency band to be filtered on the basis of a parameter supplied from the comparison operating circuit 11, and the comparison operating circuit 11 is designed to compare the output values of the first frequency accumulator 7a and the second frequency accumulator 7b, and calculate the parameter for the variable-band loop filter 13 so that the comparison result falls within a set value. The other components are the same as the corresponding components of the first embodiment illustrated in FIG. 1, except that there is no adding component formed with the digital-analog converter 9. Therefore, the corresponding components are denoted by the same reference numerals as those used in FIG. 1, and explanation thereof is not made herein.

The operating principle of the PLL circuit according to the third embodiment having the above configuration is basically the same as that of the second embodiment. That is, the bandwidth of the variable-band loop filter 13 is increased only at points where the frequency change is steep. As a result, the amount of electric charge to be supplied increases, and the frequency followability improves accordingly.

It is also effective to combine the second embodiment and the third embodiment, to simultaneously control the parameters for both the charge pump and the loop filter.

As described above, the PLL circuit according to the third embodiment includes: a voltage-controlled oscillator that transmits a frequency signal corresponding to the voltage of a supplied signal; a variable frequency divider that performs frequency dividing on the output signal of the voltage-controlled oscillator at a supplied frequency dividing ratio; a phase frequency comparator that compares the output signal of the variable frequency divider with a reference signal; a charge pump that outputs a signal corresponding to a result of the comparison performed by the phase frequency comparator; a loop filter that supplies a signal obtained by smoothing the output of the charge pump to the voltage-controlled oscillator, and is capable of changing the frequency band to be filtered, depending on a supplied parameter; a ΔΣ modulator that generates the frequency dividing ratio for the variable frequency divider depending on a supplied signal; a first frequency accumulator that operates using the output of the variable frequency divider as a clock, and generates an output value corresponding to the clock as an input value for the ΔΣ modulator; a second frequency accumulator that operates using the reference signal as a clock, and generates an output value corresponding to the clock; and a comparison operating circuit that compares the output values of the first frequency accumulator and the second frequency accumulator, and calculates the parameter for the loop filter so that the comparison result falls within a set value. With this configuration, the output signal from the loop filter can be made to accurately follow changes in frequency. As a result, for the output signal of the PLL circuit, it is possible to cope with steep changes in frequency.

Fourth Embodiment

Figure 7:
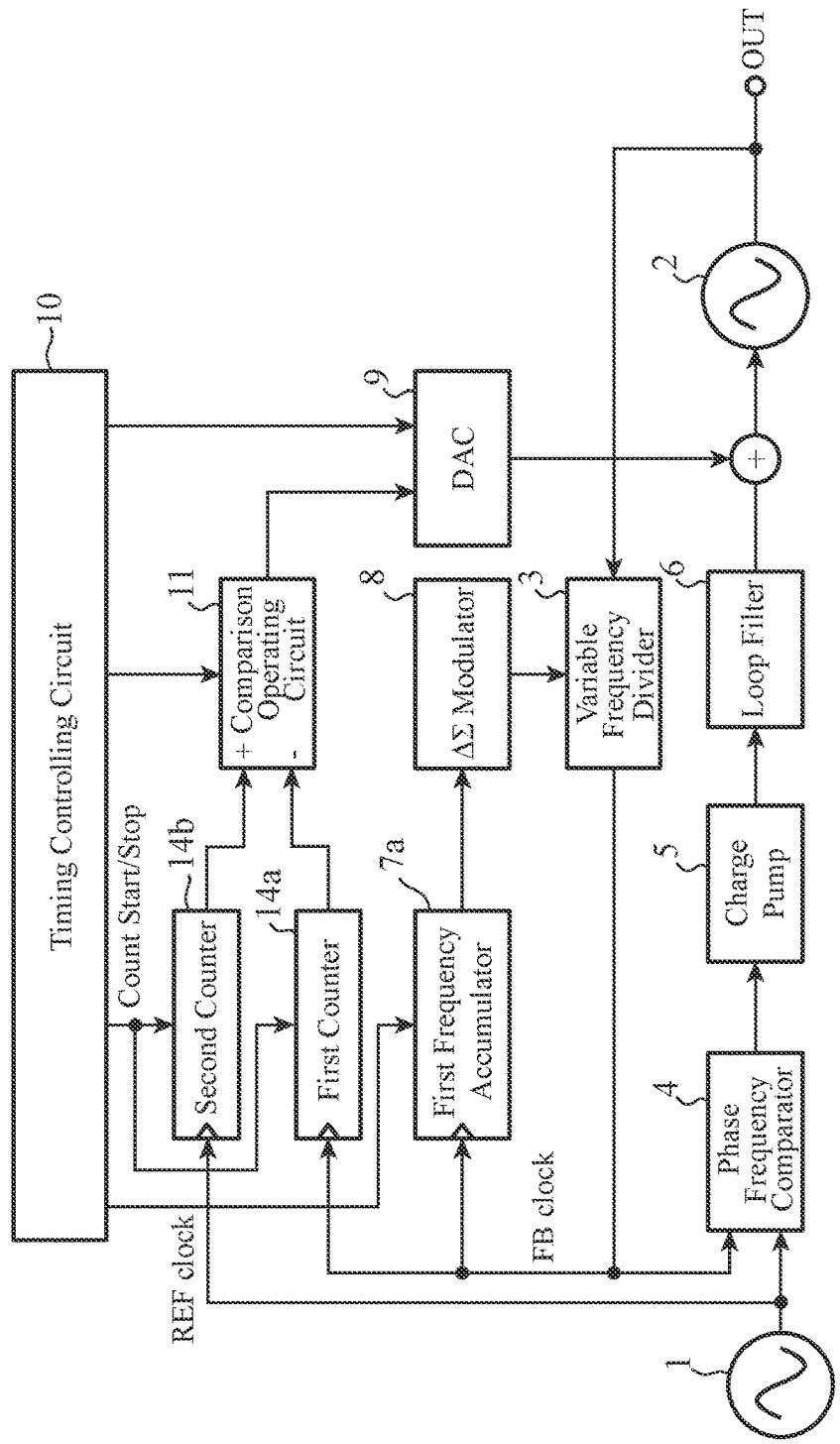
FIG. 7 is a configuration diagram of a PLL circuit according to a fourth embodiment of the present invention.

FIG. 7 shows an example of a PLL circuit according to a fourth embodiment. The difference from the first embodiment is that the second frequency accumulator 7b is replaced with both a first counter 14a that operates using the output of the variable frequency divider 3 as a clock and outputs a count value corresponding to this clock, and a second counter 14b that operates using a reference signal from the reference signal source 1 as a clock and outputs a count value corresponding to this clock, and the comparison operating circuit 11 compares the count values of the first counter 14a and the second counter 14b, and calculates a parameter so that the difference between the count values falls within a set value. The other components are the same as the corresponding components of the first embodiment illustrated in FIG. 1. Therefore, the corresponding components are denoted by the same reference numerals as those used in FIG. 1, and explanation thereof is not made herein.

In the PLL circuit according to the fourth embodiment, an output of a frequency accumulator is not input to the comparison operating circuit 11, but the output value of the first counter 14a operating with the FB clock and the output value of the second counter 14b operating with the REF clock are input to the comparison operating circuit 11. This eliminates the need for the PLL circuit to include two frequency accumulators. By providing the two counters having the necessary minimum functions, the same functions as those of the first embodiment can be achieved while the circuit size of the entire PLL circuit is reduced. That is, since the first and second counters 14a and 14b in the fourth embodiment are circuits that merely each count the number of input clocks, the circuit size of each counter is significantly smaller than that of the frequency accumulator. Accordingly, it is possible to reduce the entire circuit size by providing the first and second counters 14a and 14b in place of the second frequency accumulator 7b.

As described above, in the PLL circuit according to the fourth embodiment, the second frequency accumulator of the first embodiment is replaced with both a first counter that operates using the output of the variable frequency divider as a clock and outputs a count value corresponding to the clock, and a second counter that operates using the reference signal as a clock and outputs a count value corresponding to the clock, and the comparison operating circuit of the first embodiment is replaced with a comparison operating circuit that calculates a parameter so that the difference between the count values of the first counter and the second counter falls within a set value. With this configuration, the same effects as those of the first embodiment can be achieved, and further, the circuit size of the entire PLL circuit can be reduced.

Fifth Embodiment

Figure 8:
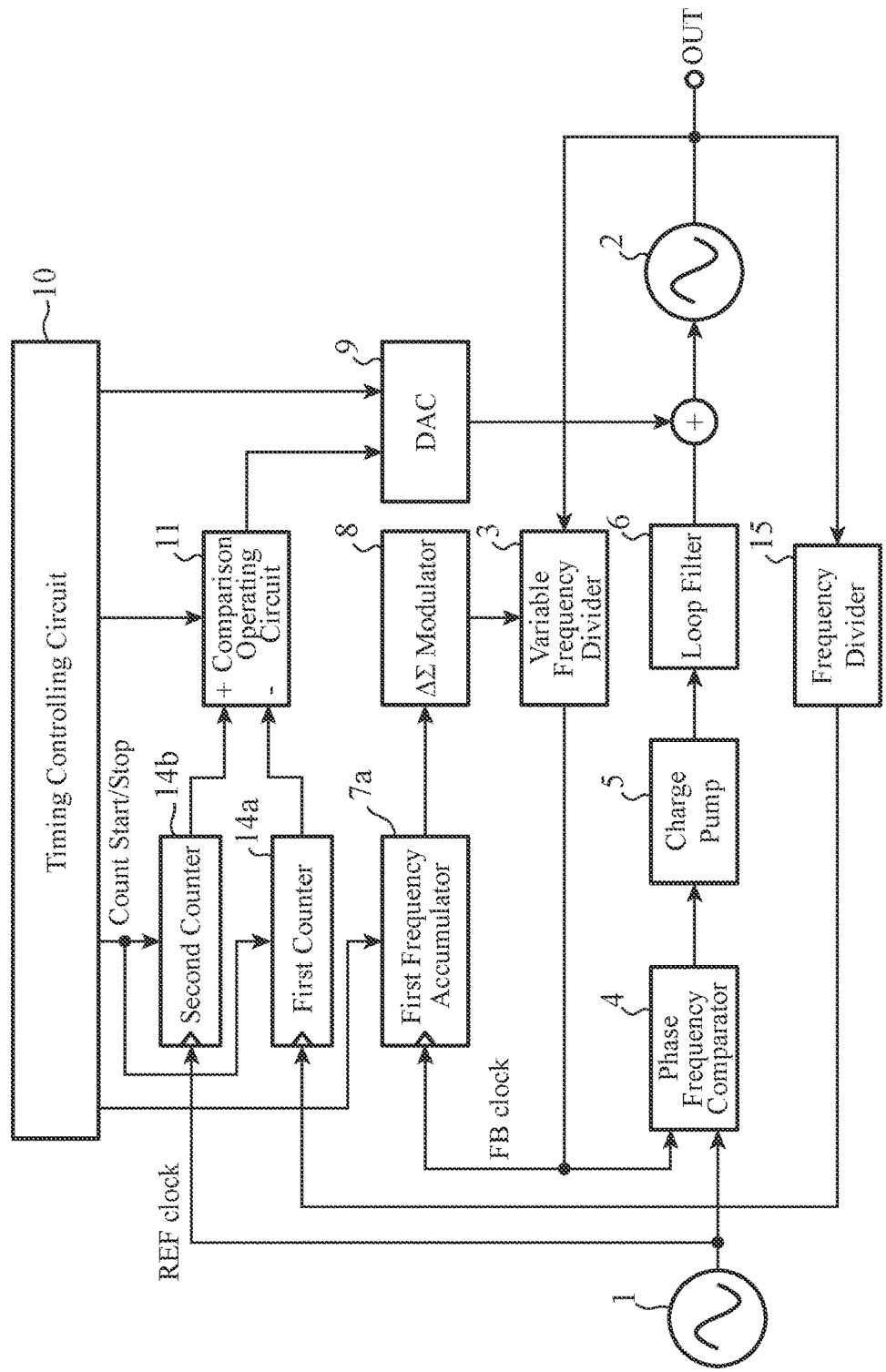
FIG. 8 is a configuration diagram of a PLL circuit according to a fifth embodiment of the present invention.

FIG. 8 shows an example of a PLL circuit according to a fifth embodiment. The difference from the fourth embodiment is that the output of a newly added frequency divider 15, not the output of the variable frequency divider 3, is used as the clock in the first counter 14a. That is, the frequency divider 15 is a frequency divider that performs frequency dividing on the output signal of the voltage-controlled oscillator 2, and the first counter 14a is designed to operate using the output signal of the frequency divider 15 as a clock. The other components are the same as the corresponding components of the fourth embodiment illustrated in FIG. 7. Therefore, the corresponding components are denoted by the same reference numerals as those used in FIG. 7, and explanation thereof is not made herein.

In the fifth embodiment, the first counter 14a operates using the output signal of the frequency divider 15 as a clock. Therefore, even in a case where an ideal chirp signal is output from the voltage-controlled oscillator 2, the outputs of the first counter 14a and the second counter 14b have different values. This is the aspect different from the fourth embodiment. In view of this, the difference value between the outputs of the counters in a case where the ideal chirp signal is output from the voltage-controlled oscillator 2 is calculated beforehand, and the comparison operating circuit 11 controls the parameter for the digital-analog converter 9 so that the difference value between the output values of the two counters converges on the beforehand calculated difference value.

Although any appropriate value can be set as the frequency dividing ratio in the frequency divider 15, a smaller value than the frequency dividing ratio in the variable frequency divider 3 is set, so that the clock frequency of the first counter 14a becomes higher than the frequency of the FB clock. Accordingly, a higher time resolution than that of the circuit according to the fourth embodiment can be achieved, and the difference from the ideal waveform of the chirp signal can be measured with higher precision.

As described above, in the PLL circuit according to the fifth embodiment, a frequency divider that performs frequency dividing on the output signal of the voltage-controlled oscillator is provided, the second frequency accumulator of the first embodiment is replaced with both a first counter that operates using the output of the frequency divider as a clock and outputs a count value corresponding to the clock, and a second counter that operates using the reference signal as a clock and outputs a count value corresponding to the clock, and the comparison operating circuit of the first embodiment is replaced with a comparison operating circuit that calculates a parameter so that the difference between the count values of the first counter and the second counter falls within a set value. With this configuration, not only the same effects as those of the fourth embodiment but also a higher time resolution can be achieved. Thus, the difference from the ideal waveform of the chirp signal can be measured with higher precision.

Note that, in the fourth and fifth embodiments, the first counter 14a and the second counter 14b are used in the configuration of the first embodiment. However, the first counter 14a and the second counter 14b may be used in the configurations of the second and third embodiments.

Note that, within the scope of the present invention, the embodiments may be freely combined, modifications may be made to any component of each embodiment, or any component may be omitted from each embodiment.

INDUSTRIAL APPLICABILITY

As described above, a PLL circuit according to the present invention is a PLL circuit that adds the output of a digital-analog converter between a voltage-controlled oscillator and a loop filter, and causes the frequency control voltage of the voltage-controlled oscillator to shift at a higher speed than in the PLL loop band. In this circuit, the parameter for the digital-analog converter is determined, and the PLL circuit appropriately generates the chirp signal to be used as transmission waves of an FMCW radar.

REFERENCE SIGNS LIST

1: Reference signal source, 2: Voltage-controlled oscillator, 3: Variable frequency divider, 4: Phase frequency comparator, 5: Charge pump, 6: Loop filter, 7a: First frequency accumulator, 7b: Second frequency accumulator, 8: ΔΣ modulator, 9: Digital-analog converter, 10: Timing controlling circuit, 11: Comparison operating circuit, 12: Variable-current charge pump, 13: Variable-band loop filter, 14a: First counter, 14b: Second counter, 15: Frequency divider.

The invention claimed is:

1. A PLL circuit comprising:
   a voltage-controlled oscillator to transmit a frequency signal corresponding to a voltage of a supplied signal;
   a variable frequency divider to perform frequency dividing on an output signal of the voltage-controlled oscillator at a supplied frequency dividing ratio;
   a phase frequency comparator to compare an output signal of the variable frequency divider with a reference signal;
   a charge pump to output a signal corresponding to a result of the comparison performed by the phase frequency comparator;
   a loop filter to supply a signal obtained by smoothing the output signal of the charge pump to the voltage-controlled oscillator;
   a ΔΣ modulator to generate the frequency dividing ratio for the variable frequency divider depending on a supplied signal;
   a first frequency accumulator to operate using the output signal of the variable frequency divider as a clock, and generate an output value corresponding to the clock as an input value for the ΔΣ modulator;
   a second frequency accumulator to operate using the reference signal as a clock, and generate an output value corresponding to the clock;
   a comparison operating circuit to compare the output values of the first frequency accumulator and the second frequency accumulator, and calculate a parameter so that a result of the comparison falls within a set value; and
   a digital-analog converting circuit to output a signal to be added to an output of the loop filter depending on the parameter output from the comparison operating circuit.

2. The PLL circuit according to claim 1, wherein
   the second frequency accumulator of claim 1 is replaced with both a first counter that operates using the output signal of the variable frequency divider as a clock and outputs a count value corresponding to the clock, and a second counter that operates using the reference signal as a clock and outputs a count value corresponding to the clock, and
   the comparison operating circuit of claim 1 is replaced with a comparison operating circuit that calculates the parameter so that a difference between the count values of the first counter and the second counter falls within a set value.

3. The PLL circuit according to claim 1, further comprising
   a frequency divider to perform frequency dividing on the output signal of the voltage-controlled oscillator, wherein
   the second frequency accumulator of claim 1 is replaced with both a first counter that operates using an output signal of the frequency divider as a clock and outputs a count value corresponding to the clock, and a second counter that operates using the reference signal as a clock and outputs a count value corresponding to the clock, and
   the comparison operating circuit of claim 1 is replaced with a comparison operating circuit that calculates the parameter so that a difference between the count values of the first counter and the second counter falls within a set value.

4. A PLL circuit comprising:
   a voltage-controlled oscillator to transmit a frequency signal corresponding to a voltage of a supplied signal;
   a variable frequency divider to perform frequency dividing on an output signal of the voltage-controlled oscillator at a supplied frequency dividing ratio;
   a phase frequency comparator to compare an output signal of the variable frequency divider with a reference signal;
   a charge pump to output a signal corresponding to a result of the comparison performed by the phase frequency comparator, the charge pump being capable of changing the output depending on a supplied parameter;
   a loop filter to supply a signal obtained by smoothing the output signal of the charge pump to the voltage-controlled oscillator;
   a ΔΣ modulator to generate the frequency dividing ratio for the variable frequency divider depending on a supplied signal;
   a first frequency accumulator to operate using the output signal of the variable frequency divider as a clock, and generate an output value corresponding to the clock as an input value for the ΔΣ modulator;
   a second frequency accumulator to operate using the reference signal as a clock, and generate an output value corresponding to the clock; and
   a comparison operating circuit to compare the output values of the first frequency accumulator and the second frequency accumulator, and calculate the parameter for the charge pump so that a result of the comparison falls within a set value.

5. A PLL circuit comprising:
   a voltage-controlled oscillator to transmit a frequency signal corresponding to a voltage of a supplied signal;
   a variable frequency divider to perform frequency dividing on an output signal of the voltage-controlled oscillator at a supplied frequency dividing ratio;
   a phase frequency comparator to compare an output signal of the variable frequency divider with a reference signal;
   a charge pump to output a signal corresponding to a result of the comparison performed by the phase frequency comparator;
   a loop filter to supply a signal obtained by smoothing the output signal of the charge pump to the voltage-controlled oscillator, the loop filter being capable of changing a frequency band to be filtered depending on a supplied parameter;
   a ΔΣ modulator to generate the frequency dividing ratio for the variable frequency divider depending on a supplied signal;
   a first frequency accumulator to operate using the output signal of the variable frequency divider as a clock, and generate an output value corresponding to the clock as an input value for the ΔΣ modulator;
   a second frequency accumulator to operate using the reference signal as a clock, and generate an output value corresponding to the clock; and
   a comparison operating circuit to compare the output values of the first frequency accumulator and the second frequency accumulator, and calculate the parameter for the loop filter so that a result of the comparison falls within a set value.

* * * * *